United States Patent
Chao et al.

(10) Patent No.: US 7,440,306 B2
(45) Date of Patent: Oct. 21, 2008

(54) METHOD FOR PROGRAMMING ONE-TIME PROGRAMMABLE MEMORY OF INTEGRATED CIRCUIT

(75) Inventors: Po-Yin Chao, Taipei Hsien (TW); Kuo-Yuan Yuan, Taipei Hsien (TW); Hsiang-Min Lin, Taipei Hsien (TW)

(73) Assignee: Fortune Semiconductor Corporation, Taipei (TW)

( * ) Notice: Subject to any disclaimer, the term of this patent is extended or adjusted under 35 U.S.C. 154(b) by 326 days.

(21) Appl. No.: 11/465,589

(22) Filed: Aug. 18, 2006

(65) Prior Publication Data
US 2008/0043508 A1 Feb. 21, 2008

(51) Int. Cl.
*G11C 17/00* (2006.01)

(52) U.S. Cl. .................. 365/94; 365/189.011; 702/189

(58) Field of Classification Search ............... 365/94, 365/189.011; 702/189
See application file for complete search history.

(56) References Cited

U.S. PATENT DOCUMENTS

| 6,160,734 | A * | 12/2000 | Henderson et al. ...... 365/185.04 |
| 7,167,411 | B2 * | 1/2007 | Ahn ...................... 365/189.05 |
| 2007/0226477 | A1 * | 9/2007 | Haban et al. ................... 713/1 |

* cited by examiner

*Primary Examiner*—Anh Phung
*Assistant Examiner*—Toan Le

(57) ABSTRACT

A method for programming a one-time programmable memory of an integrated circuit includes the following steps: writing an instruction set into the one-time programmable memory via a first programmable interface, running a programmable self-instruction of the instruction set, and writing a proofreading value of the integrated circuit into the one-time programmable memory via a second programmable interface. The present method takes full advantage of the one-time programmable memory. Manufacturers for manufacturing integrated circuits don't write various proofreading values corresponding to different applications. A producing efficiency can be increased, and a producing cost can be decreased. The present integrated circuit needs not to be communicated with an addition storing device, so the present integrated circuit has a simple construction, and the cost can be decreased. Since the present integrated circuit can write perform a proofreading self-instruction, the producing cost can be decreased.

17 Claims, 2 Drawing Sheets

METHOD FOR PROGRAMMING ONE-TIME PROGRAMMABLE MEMORY OF INTEGRATED CIRCUIT

BACKGROUND OF THE INVENTION

1. Field of the Invention

The present invention relates to integrated circuits, and particularly to a method for programming one-time programmable (OTP) memories of an integrated circuit (IC).

2. Description of the Related Art

Currently, a conventional integrated circuit for measurement includes an analog digital converter (ADC), a micro control unit (MCU), a system memory, and so on. Furthermore, the MCU includes a random access memory (RAM), a central processing unit (CPU) and a programmable interface, etc.

When an integrated circuit is utilized in measuring devices, sensors for measuring pressures or weights are receiving measuring signals. The sensors convert the measuring signals to electrical signals, such as voltage signals or current signals. The electrical signals are converted into digital signals by the analog-to-digital converter of the integrated circuit. And then, the digital signals are computed, processed or further converted by the MCU, and are displayed on an external display. The MCU computes, processes or further converts the signals by an instruction set stored in the system memory. The total and order of the instructions construct a program.

However, in the above utilizations, many of the integrated circuits having an analog-to-digital converter must perform a proofreading process before displaying an accurate measuring value. In the proofreading process, a standard measuring object having standard values is used. A sensor communicates with the standard measuring object to send out a standard signal. The standard signal is converted to a digital signal used as a standard value to be stored in the memory. When the MCU performs a normal measuring program, the standard value is taken out to compute an actual measuring value according to a measuring signal. After the proofreading process, a proofreading coefficient is produced correspondingly. The proofreading coefficient must be stored and can be read by the MCU, so that the MCU can accurately perform a computation or a convertation to obtain an accurate value. Therefore, most of electrical elements require an electrically erasable programmable read-only memory (EEPROM) to store the proofreading coefficient.

However, an additional burner is needed to write the proofreading accurately in the EEPROM. After the step of writing, the EEPROM is taken out from the burner and is communicated with an electrical measuring device of a terminal system to finish the proofreading process.

Generally, when the standard value is stored in a peripheral memory, the MCU stores the standard value in the peripheral memory via a programmable interface. The peripheral memory storing the standard values will increase a cost of an integrated circuit and complicate a configuration of the integrated circuit, such as increasing a serial interface. Furthermore, an instruction set must be stored in a system memory to be read and performed by the MCU. Generally, the system memory still has a large unused space after storing the instruction set, and thus, the unused memory will be wasted.

What is needed is to provide a method for programming a one-time programmable memory of an integrated circuit with a simple proofreading process and a low cost.

BRIEF SUMMARY

A method for programming a one-time programmable memory of an integrated circuit according to a preferred embodiment includes the following steps: writing an instruction set into the one-time programmable memory via a first programmable interface, and performing a programmable self-instruction of the instruction set, and writing a proofreading value of the integrated circuit into the one-time programmable memory via a second programmable interface.

In the above method for programming, the instruction set is written into the one-time programmable memory via a peripheral device communicated with the first programmable interface. The proofreading value is written into the one-time programmable memory via a micro control unit of the integrated circuit communicated with the second programmable interface, and the second programmable interface is defined in the micro control unit. The first and second programmable interfaces are communicated with the one-time programmable memory via a multiplexer, and the multiplexer is configured for switching the first and the second programmable interfaces to communicated with the one-time programmable memory. A writing time for writing the proofreading value is written into the one-time programmable memory by the micro control unit, and is defined by a standard of the one-time programmable memory. A writing time for writing the proofreading value is written into the one-time programmable memory by the micro control unit and is stored into the instruction set.

A method for programming a one-time programmable memory of an integrated circuit according to another preferred embodiment includes the following steps: writing an instruction set into the one-time programmable memory of the integrated circuit, performing a programmable program of the instruction set by a micro control unit of the integrated circuit, and writing a proofreading value into the one-time programmable memory by the micro control unit under a writing instruction of the programmable program.

In the above method for programming, a writing time for writing the instruction is defined by a standard of the one-time programmable memory. The instruction set is written into the one-time programmable memory via a peripheral device communicated with the first programmable interface of the integrated circuit. The proofreading value is written into the one-time programmable memory via a programmable interface of the micro control unit of the integrated circuit. A writing time for the one-time programmable memory is defined by the micro control unit based on the writing instruction.

A method for programming a one-time programmable memory of an integrated circuit according to still another preferred embodiment includes the following steps: reading a programmable self-instruction from the one-time programmable memory, turning the one-time programmable memory to a programmable self-model, and performing the programmable instruction and writing a proofreading value of the integrated circuit into the one-time programmable memory during a writing time.

In the above method for programming, the proofreading value is written into the one-time programmable memory by a micro control unit of the integrated circuit. The writing time is defined by a standard of the one-time programmable memory. The writing time is stored into the programmable self-instruction. A time delay is defined between turning the one-time programmable memory to the programmable self-model and writing the proofreading value thereinto, and the time delay is configured to ensure rising inner voltages of the integrated circuit with stabilization to begin in writing the proofreading value. A time delay is defined before finishing the programmable self-model to ensure voltages of the integrated circuit with stabilization.

The present method for programming a one time programmable memory of an integrated circuit use two kinds of methods to write the instruction set and the proofreading value into the system memory, respectively. Therefore, the integrated circuit has a simple construction. Furthermore, because the proofreading value is stored in the system memory, the system memory has been utilized efficiently, and a cost of the integrated circuits has been reduced.

Manufacturers of manufacturing integrated circuits do not write various proofreading values corresponding to different applications. A producing efficiency can be increased, and a producing cost can be reduced.

For manufacturers of using the integrated circuits, the proofreading program is simplified. Therefore, a producing efficiency can be increased, and a producing cost can be reduced.

Since the integrated circuit can perform a programmable self-model to write proofreading values itself, the integrated circuit being manufactured completely, can proofread itself. Since the proofreading values are stored into the system memory of the integrated circuit, a peripheral memory can be not needed to store the proofread values. Therefore, the present integrated circuit does not need to be communicated with an addition storing device, such as EEPROM, so the present integrated circuit has a simple construction, and the cost can be reduced.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Reference will now be made to the drawings to describe a preferred embodiment of the present invention, in detail.

Figure 1:
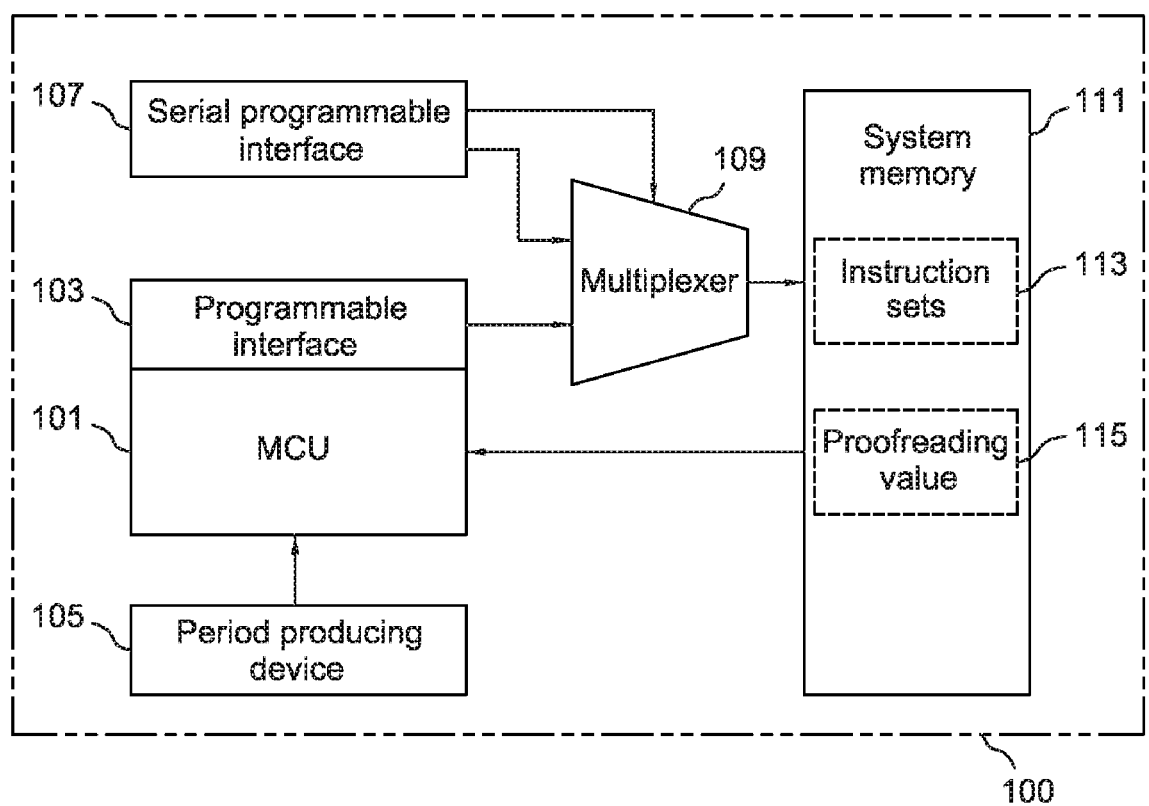
FIG. 1 is a schematic view of an integrated circuit in accordance with a first preferred embodiment of the present invention.

Referring to FIG. 1, an integrated circuit 100 in accordance with a preferred embodiment is shown. The integrated circuit 100 includes a MCU 101 having a programmable interface 103, a period producing device 105, a serial programmable interface 107, a multiplexer 109 and a system memory 111. The MCU 101 is communicated with the system memory 111 via the programmable interface 103 and the multiplexer 109. The serial programmable interface 107 is communicated with the system memory 111 via the multiplexer 109. The MCU 101 is further communicated with the period producing device 105. The MCU 101 must perform an instruction under a frequency period produced by the period producing device 105. The system memory 111 may be an OTP memory, such as EPROM.

When the integrated circuit 100 is on operation, the MCU 101 takes out a need instruction from the system memory 111 to perform. The integrated circuit 100 performs a proofreading process to obtain a proofreading value 115, and then, the proofreading value 115 is stored in the system memory 111.

When the MCU 101 performs a measuring process, the MCU computes a factual value from a measuring signal transmitted from a sensor and the proofreading value 115 taken out from the system memory 111. Therefore, the system memory 111 can store an instruction set 113 and the proofreading values 115 together, and a method for storing the instruction set 113 is different from that for storing the proofreading values 115.

The MCU 101 is operated by instructions of the instruction set 113, so that the instruction set 113 must be stored in the system memory 111 before operating the integrated circuit 110. Then MCU 101 takes out the instructions from the instruction set 113 to perform them. The instruction set 113 is put into the integrated circuit 100 from a peripheral device. The peripheral device put the instruction set 113 into the system memory 111 via the serial programmable interface 107 and the multiplexer 109. Since the MCU 101 can not be operated before the integrated circuit 100 being operated, the instruction set 113 is put into the system memory 111 via the serial programmable interface 107. After storing the instruction set 113, a proofreading program of the integrated circuit 100 begins to be performed. The MCU 101 computes the proofreading value after receiving a standard signal of a standard object, and then the proofreading value is stored in the system memory 111 via the programmable interface 103 and the multiplexer 109. The MCU 101 performs the instructions under a frequency period produced by the period producing device 105.

In this embodiment, the instruction set 113 and the proofreading value 115 are written into the system memory 111 via the serial programmable interface 107 and the programmable interface 103 respectively to the multiplexer 109, and then from the multiplexer 109 to the system memory 111. The written process includes the steps of: a first step of writing the instruction set 113 into the system memory 111, and a second step of the MCU 101 performing a programmable instruction of the instruction set 113 and writing the proofreading value 115 into the system memory 111 via the programmable interface 103.

In this embodiment, the system memory 111 has two kinds of methods for programming. Firstly, the peripheral device enters the instruction set 113 via the serial programmable interface 107. Secondly, the programmable instruction of the instruction set 113 is performed, and the proofreading value 115 is written into the system memory 111. That is, firstly, the system memory 111 is programmed by the peripheral device, then the programmable instruction of the instruction set 113 is performed, and the MCU performs the programmable instruction to program the system memory 111 itself.

In this embodiment, when the MCU 101 performs a normal instruction, the MCU 101 is communicated with the system memory 111 via the programmable interface 103. The MCU 101 sends a reading address and a frequency period to the system memory 111 via the programmable interface 103. Then the system memory 111 sends the instruction set 113 or the proofreading value 115 to the MCU 101 to perform a reading flow.

Figure 2:
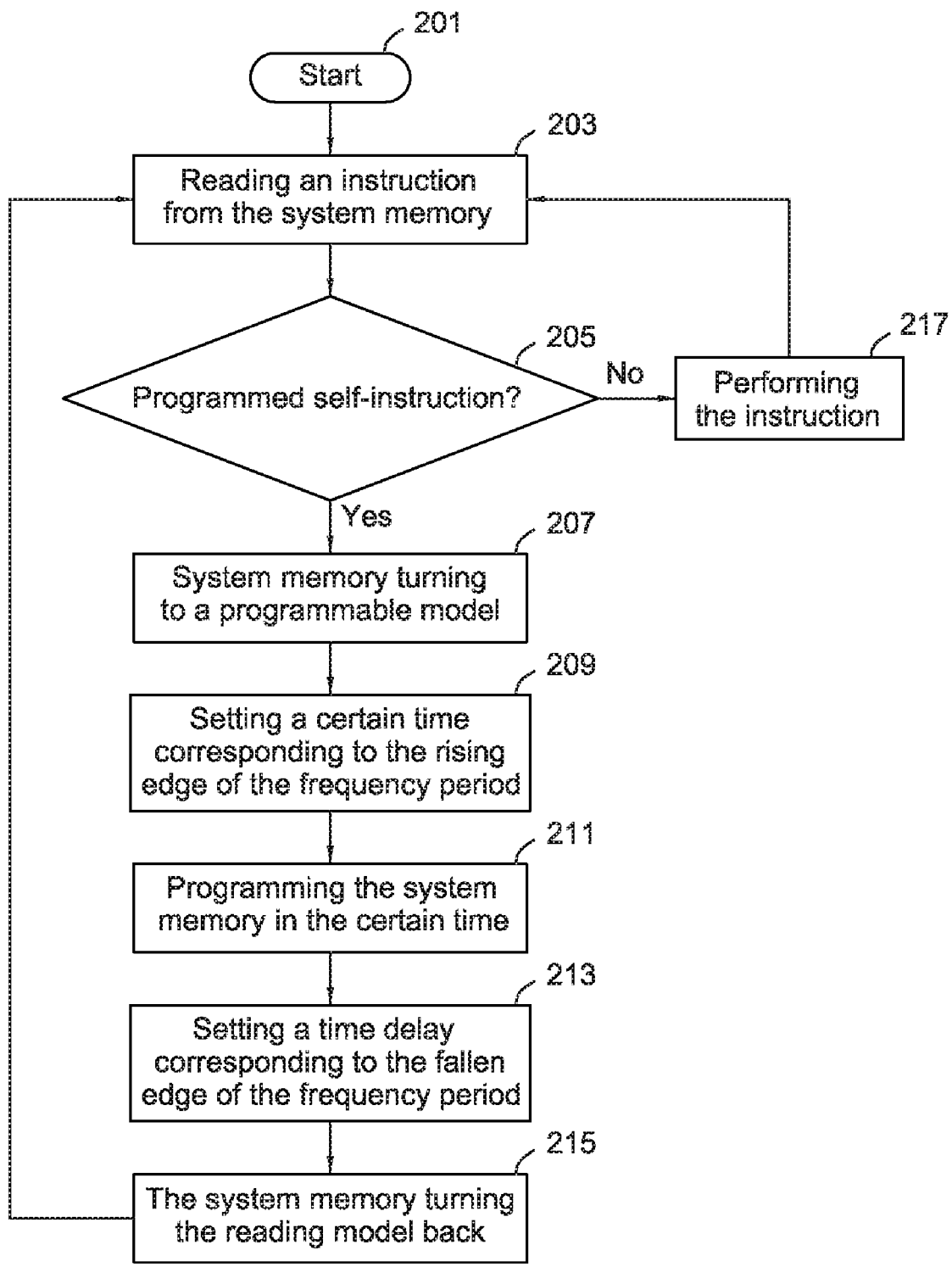
FIG. 2 is a flowing chart of a method for programming a one-time programmable memory of the integrated circuit of FIG. 1.

Referring to FIG. 2, a flowing chart of the integrated circuit programming itself is shown. In a step 201, the MCU 101 begins to perform a program. In a step 203, the MCU 101 reads an instruction from the system memory 111. In a step 205, the MCU 101 determines whether the instruction is a programmed self-instruction or not. If it is, a step 207 is performed; and if it is not, a step 217 is performed to make the MCU 101 performing the instruction directly, and then the flow returns the step 203. In a step 207, the system memory 111 turns to a programmable model to write the proofreading value 115. In a step 209, the MCU 101 performs the programmable instruction according to the frequency period produced by the period producing device 105. The MCU 101 performs the programmable instruction corresponding to the rising edge of the frequency period. Since the writing voltage of the system memory 111 is higher than the operating voltage of the system memory 111, thus the MCU 101 must predetermine a delay time to ensure a raised inner voltage of the integrated circuit 101 stabilizing, and then to begin to write. In a step 211, the system memory 111 is programmed in a certain time and is written the proofreading value 115 thereinto. The certain writing time depends on a standard of the system memory 111. When the system memory 111 has a certain writing time, the MCU 101 performs the programmable instruction according to the frequency period, and controls the writing time of the proofreading value 115 by computing a number of the frequency period based on the certain writing time. In this embodiment, the system memory 111 may be an EPROM or another OTP-memory. The writing time of the system memory 111 is relative to a standard of the system memory 111. When the integrated circuit 100 uses a different EPROM or another OTP-memory, the writing time of the system memory 111 alters with that. A length of the writing time can be altered only by altering the writing time value of the programmable instruction of the instruction set 113.

A step 213 is performed after performing the step 211. The MCU 101 defines a time delay corresponding to a falling edge of the frequency period. Since the writing voltage of the system memory 111 is higher than the operating voltage, the time delay must be predefined before finishing the programmable instruction to ensure the voltage of the integrated circuit 100 stabilizing. Then a step 215 is performed to turn the system memory 111 to the reading model. The MCU 101 performs the step 203 to read the requiring instruction of the system after returning to the reading model.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method for programming a one-time programmable memory of an integrated circuit, comprising the following steps:
    writing an instruction set into the one-time programmable memory via a first programmable interface; and
    performing a programmable self-instruction of the instruction set, and writing a proofreading value of the integrated circuit into the one-time programmable memory via a second programmable interface.

2. The method as claimed in claim 1, wherein the instruction set is written into the one-time programmable memory via a peripheral device communicated with the first programmable interface.

3. The method as claimed in claim 1, wherein the proofreading value is written into the one-time programmable memory via a micro control unit of the integrated circuit communicated with the second programmable interface, the second programmable interface being defined in the micro control unit.

4. The method as claimed in claim 1, wherein the first and second programmable interfaces are communicated with the one-time programmable memory via a multiplexer, the multiplexer being configured for switching the first and the second programmable interfaces to communicated with the one-time programmable memory.

5. The method as claimed in claim 1, wherein a writing time for writing the proofreading value is written into the one-time programmable memory by the micro control unit, and is defined by a standard of the one-time programmable memory.

6. The method as claimed in claim 1, wherein a writing time for writing the proofreading value is written into the one-time programmable memory by the micro control unit and is stored into the instruction set.

7. A method for programming a one-time programmable memory of an integrated circuit, comprising the following steps:
    writing an instruction set into the one-time programmable memory of the integrated circuit;
    performing a programmable program of the instruction set by a micro control unit of the integrated circuit; and
    writing a proofreading value into the one-time programmable memory by the micro control unit under a writing instruction of the programmable program.

8. The method as claimed in claim 7, wherein a writing time for writing the instruction is defined by a standard of the one-time programmable memory.

9. The method as claimed in claim 7, wherein the instruction set is written into the one-time programmable memory via a peripheral device communicated with the first programmable interface of the integrated circuit.

10. The method as claimed in claim 7, wherein the proofreading value is written into the one-time programmable memory via a programmable interface of the micro control unit of the integrated circuit.

11. The method as claimed in claim 7, wherein a writing time for the one-time programmable memory is defined by the micro control unit based on the writing instruction.

12. A method for programming a one-time programmable memory of an integrated circuit, comprising the following steps:
    reading a programmable self-instruction from the one-time programmable memory;
    turning the one-time programmable memory to a programmable self-model; and
    performing the programmable instruction, and writing a proofreading value of the integrated circuit into the one-time programmable memory during a writing time.

13. The method as claimed in claim 12, wherein the proofreading value is written into the one-time programmable memory by a micro control unit of the integrated circuit.

14. The method as claimed in claim 12, wherein the writing time is defined by a standard of the one-time programmable memory.

15. The method as claimed in claim 12, wherein the writing time is stored into the programmable self-instruction.

16. The method as claimed in claim 12, wherein a time delay is defined between turning the one-time programmable memory to the programmable self-model and writing the proofreading value thereinto, the time delay being configured to ensure rising inner voltages of the integrated circuit with stabilization to begin in writing the proofreading value.

17. The method as claimed in claim 12, wherein a time delay is defined before finishing the programmable self-model to ensure voltages of the integrated circuit with stabilization.

* * * * *